United States Patent [19]
Yamanaka

[11] Patent Number: 5,138,180
[45] Date of Patent: Aug. 11, 1992

[54] WIRE BONDING INSPECTING APPARATUS UTILIZING A CONTROLLING MEANS FOR SHIFTING FROM ONE INSPECTED AREA TO ANOTHER

[75] Inventor: Kazuyuki Yamanaka, Fujisawa, Japan

[73] Assignee: Kabushiki Kaisha Toshiba, Kawasaki, Japan

[21] Appl. No.: 568,033

[22] Filed: Aug. 16, 1990

[30] Foreign Application Priority Data

Aug. 18, 1989 [JP] Japan .................. 1-212172

[51] Int. Cl.⁵ ............................. G01N 21/86
[52] U.S. Cl. ...................... 250/561; 356/394; 358/106
[58] Field of Search ............ 250/561, 548, 560; 356/393, 394; 358/101, 106, 107

[56] References Cited

U.S. PATENT DOCUMENTS

| | | | |
|---|---|---|---|
| 4,200,393 | 4/1980 | Suzuki et al. | 250/548 |
| 4,203,132 | 5/1980 | Schmitt | 358/101 |
| 4,874,956 | 10/1989 | Kato et al. | 250/560 |

FOREIGN PATENT DOCUMENTS

0262777 6/1988 European Pat. Off. .
57-155743 9/1982 Japan .

*Primary Examiner*—David C. Nelms
*Assistant Examiner*—T. Davenport
*Attorney, Agent, or Firm*—Foley & Lardner

[57] ABSTRACT

To inspect the wire bonding of semiconductor chips of different sizes and with a broader allowability of chip mislocation on an inspection table, the inspecting apparatus includes an inspection base on which a chip is mounted; an illuminator for illuminating the wires to be inspected; an optical cylinder for forming an optical image of the wires; a video unit for generating video signals; an image processing unit for recognizing wire shapes and measuring wire bonded positions; a storage unit for storing inspection criteria; a main controller for comparing the recognized wire shapes and the measured wire bonded positions with the stored criteria to decide on chip acceptance or unacceptance; and, in particular, an x-y table for moving the optical cylinder relative to the inspection base or vice versa; and a controller for controlling the relative positional relationship between the two, so that an inspection area can be image-formed by the optical cylinder at a correct inspection position.

4 Claims, 3 Drawing Sheets

WIRE BONDING INSPECTING APPARATUS UTILIZING A CONTROLLING MEANS FOR SHIFTING FROM ONE INSPECTED AREA TO ANOTHER

BACKGROUND OF THE INVENTION

The present invention relates to a wire bonding inspecting apparatus, and more specifically to a wire bonding inspecting apparatus for automatically inspecting wires bonded between a semiconductor chip and leads.

In order to secure the quality and reliability of a semiconductor device, it is indispensable to inspect wires bonded between a semiconductor chip and leads, to determine whether wires are bonded at incorrect positions; whether wires are extended straight; if wires are not cut off; or the like. When the above-mentioned inspection is performed visually, there exist various problems of lower reliability due to human error, irregularity due to worker error, waste of time because a long time is required from when wires have been bonded to when the inspection is started, etc. Recently, therefore, it is usual to automatically inspect the wire bonding of a semiconductor device by an apparatus.

In the conventional automatic wire bonding inspecting apparatus, in general, an image of a semiconductor chip on which wires have been bonded is optically formed on a screen as a magnified picture; transduced into video signals; and then compared with reference data (criteria) to determine whether the semiconductor chip is acceptable or unacceptable.

In the conventional automatic wire bonding inspection apparatus, however, there exists a problem in that it is impossible to adapt the inspecting apparatus to various semiconductor chips of different sizes. This is because an area at which video signals can be generated is fixedly determined or not adjustable for each inspecting apparatus. In other words, when an inspecting apparatus designed for a relatively large-sized semiconductor chip is used to inspect a relatively small-sized semiconductor chip, there exists a wide wasteful inspection area. In contrast, when an inspecting apparatus designed for a relatively small-sized semiconductor chip is used to inspect a relatively large-sized semiconductor chip, there exists an uninspectable area, because the apparatus cannot cover the chip area perfectly.

In more detail, FIG. 1A is an optically enlarged inspection area in which there are shown a semiconductor chip 101, a number of leads 104 and a number of wires 102 bonded between a pad 103 of the chip 101 and the leads 104. In this example, since the size of the semiconductor chip 101 is relatively small, an inspection area 41 enclosed by dashed lines can cover the wires 102, the pad 103 and the bonded positions 105 on the leads 102 all to be inspected, thus resulting in no specific problems.

In contrast, FIG. 1B is a similar inspection area in which there are shown a relatively large-sized semiconductor chip 201, a number of leads 204, and a number of wires 202 bonded between a pad 203 of the chip 201 and the leads 204. In this example, however, since the size of the semiconductor chip 201 is relatively large and further, the inspection area 41 is fixed constant, the inspection area 41 enclosed by dashed lines cannot cover all the bonded positions 205 on the leads 202, thus resulting in the problem in that it is impossible to inspect all of the wire bonding conditions.

Further, since the resolving power of a video unit (video signal generator) is usually constant over all of the inspection area, when the highest possible resolution is required for a semiconductor chip of predetermined size, the semiconductor chip must be located accurately on an inspection base; that is, there exists another problem in that the allowability of offset of the semiconductor chip to be inspected relative to the inspection base is extremely narrow. In more detail, with reference to FIG. 1C, where an inspectable area 61 enclosed by the dashed line is determined to be a little broader than an inspection area 62 enclosed by solid line in order to increase the resolution, there exists a problem in that an allowable offset dimension x on one side is extremely narrow and therefore the allowability of offset in locating a semiconductor chip on the mounting base is extremely small. Although it is possible to increase the allowability x by increasing the inspection area 61, since the resolution decreases with an increasing inspection area 61, there arise other various problems in that a more expensive video signal generator is required; a longer inspection time is required and, therefore, the inspection speed slows.

SUMMARY OF THE INVENTION

With these problems in mind, therefore, it is the primary object of the present invention to provide a wire bonding inspecting apparatus applicable to semiconductor chips of different sizes and which is adaptable to semiconductor chips offset relative to the inspection base, with a large allowability thereto.

According to the present invention, there is provided a wire bonding inspecting apparatus for inspecting wires bonded between a semiconductor chip and leads, comprising: (a) mounting means for mounting the semiconductor chip wire-bonded to the leads; (b) illuminating means for illuminating the wires connected between the mounted semiconductor chip and the leads; (c) optical image forming means for optically forming an image of the illuminated wires; (d) video signal generating means for transducing the optically formed image into video signals; (e) recognizing and measuring means responsive to the video signals, for recognizing wire shapes and measuring wire bonded positions for wire inspection; (f) storing means for storing wire inspection criteria; (g) acceptance deciding means for comparing the recognized wire shapes and the measured wire bonded positions with the stored wire inspection criteria, respectively and generating an acceptance or an unacceptance signal on the basis of the compared results between the two; (h) moving means for moving the mounting means relative to the optical image forming means or vice versa; and (i) control means for controlling relative positional relationship between the mounting means and the optical image forming means so that an image of an area to be inspected can be formed by the optical image forming means.

To achieve the above-mentioned object, in the wire bonding inspecting apparatus according to the present invention, an illuminating means illuminates wires bonded between a semiconductor chip and leads, both mounted on mounting means; an optical image forming means forms an optical image thereof; a video signal generating means transduces the optical image into video signals; and a recognizing and measuring means recognizes wire shapes and measures bonded positions.

Acceptance deciding means compares the recognized and measured results with inspection criteria stored in the criteria storing means to decide the acceptance or non-acceptance of the wires bonded between the chip and the leads. In the apparatus according to the present invention, the inspection area is an area in which the chip and leads can be image-formed by the optical image-forming means, and, furthermore, this inspection area is adjustable by a shifting means. That is, the inspection area is adjustably image-formed under the control of the shifting means. Therefore, when the size of the semiconductor chip is large, the area to be inspected is divided into several subareas, and the area on which an inspected object is image-formed by the optical image forming means is shifted in sequence for inspection, thus allowing the apparatus of the present invention to be applicable to semiconductor chips of various sizes. In addition, in case the position of the semiconductor chip mounted on the mounting means is offset or displaced from a regular position, since the inspection area can be adjustably shifted, the inspection can be facilitated and the tolerance to offset of the chip relative to the mounting base is extremely increased, thus permitting the use of general-purpose image forming means and video signal generating means provided with a moderate resolving power at relatively low cost.

BRIEF DESCRIPTION OF THE DRAWINGS

FIGS. 1A to 1C are plan views showing prior-art inspection areas in relation to the size of a semiconductor chip, in which FIG. 1A shows an example where a relatively small-sized semiconductor chip is image-formed by a prior-art inspecting apparatus; FIG. 1B shows an example where a relatively large-sized semiconductor chip is image-formed by a prior-art inspecting apparatus; and FIG. 1C shows a view for assistance in explaining the allowability of chip offset relative to a predetermined position on an inspection base;

FIGS. 4A to 4C are enlarged plan views for assistance in explaining the inspection process, in which FIG. 4A is a view showing two points to be connected by a wire; and FIG. 4B is a view showing a wire location area; FIG. 4C is a view showing an actual wire position detected as a series of separated dots;

DETAILED DESCRIPTION OF THE PREFERRED EMBODIMENTS

Figure 1A:
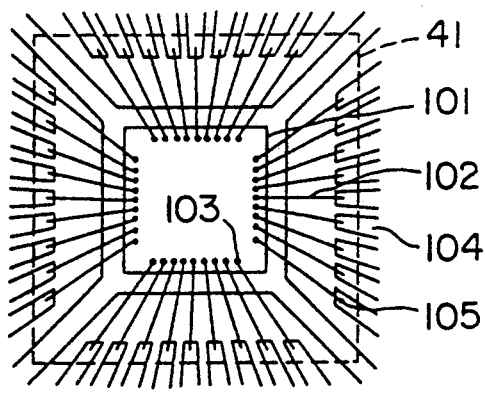
Figure 1B:
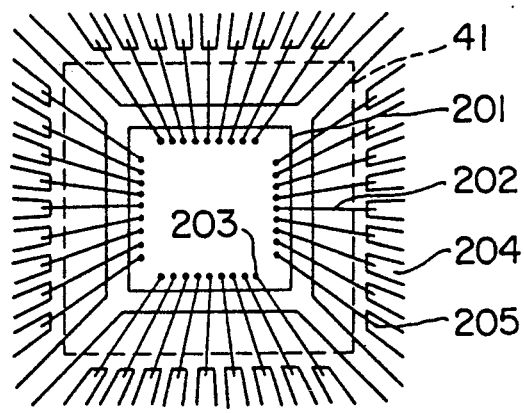
Figure 1C:
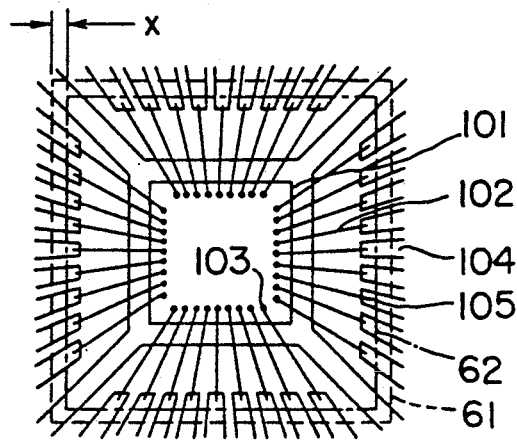
Figure 2:
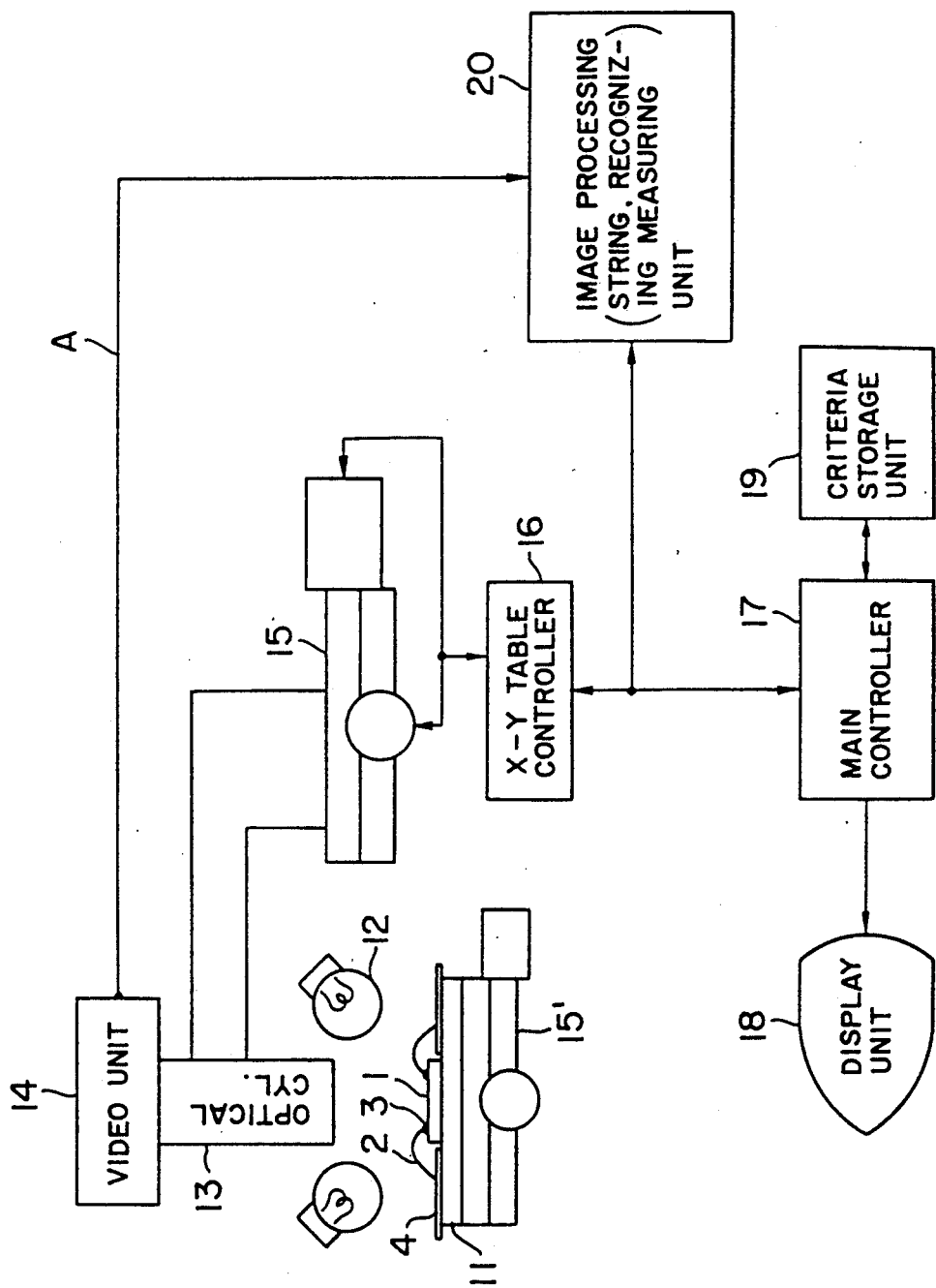
FIG. 2 is a block diagram showing an embodiment of the wire bonding inspecting apparatus according to the present invention.

An embodiment of the present invention will be described hereinbelow with reference to the attached drawings. FIG. 2 is a block diagram showing a configuration of the apparatus, a semiconductor chip 1 and leads 4 bonded by wires 2 at pads 3 is mounted on an inspection base (mounting means) 11. Under these conditions, inspections are effected as to whether the wires 2 are bonded straight (wire shape inspection); the wires 2 are bonded correctly between the pads 3 on the semiconductor chip 1 and the leads (bonding position inspection); and the wires 2 are not cut off (cut-off wire inspection). In the inspecting apparatus of the present invention, optical image-forming means is movable relative to the inspection base in both the x and y directions.

Illuminating lamps (illuminating means) 12 illuminate an object to be inspected. An optical cylinder (optical image forming means) 13 forms an optical image of an illuminated object (e.g. wires 2). A video unit (video signal generating means) 14 transduces an optical image (picture) into video signals. The transduced video signals A are applied to an image processing unit (recognizing and measuring means) 20 for storing, processing, recognizing and measuring the video signals A. In more practice, the given video signals A are temporarily stored in a storage unit, processed for binarization, partially extracted for wire shape recognition and bonding position measurements, and the processed results are supplied to a main controller 17.

An x-y table (moving means) 15 is integrally formed with the optical cylinder 13 and the video unit 14 and moved by a x-y table controller 16 on a plane in the x and y directions to move the optical image forming means relative to the inspection base 11. The x-y table 15 is shifted so that an area to be inspected is image-formed through the optical cylinder 13 by the x-y table controller 16. After some image information as to the current chip position has been input to the image processing unit 20, the optical cylinder 13 and the video unit 14 are controllably shifted to a position at which the inspection area can be image-formed correctly. A criteria storage unit (storing means) 19 stores various reference data indicative of criteria on which the shapes and bonded positions of wires 2 are determined to be acceptable or unacceptable. For instance, the correct wire positions are represented by x-y coordinates and these x-y coordinates are stored. Thereafter, the main controller (acceptance deciding means) 17 compares the measurement results of bonded positions and the recognition results of wire shapes both obtained by the image processing unit 20 with the criteria stored in the criteria storage unit 19 to decide acceptable or unacceptable chips. The decided results are displayed on a display unit (e.g., a CRT). Therefore, the main controller 17 is provided with both an acceptance/non-acceptance decision function and an optical cylinder and video unit shifting function.

The operation of the inspecting apparatus thus constructed will be described hereinbelow. The semiconductor chip 1 and the leads 4 bonded by wires 2 are mounted on the inspection base 11. An area to be inspected is optically image-formed through the optical cylinder 13. An optical image is transduced into video signals by the video unit 14 and supplied to the image processing unit 20. This image processing unit 20 starts operating in response to an inspection start command from the main controller 17 for various video signal processing such as binarization, noise elimination through filters, etc.

The processed video signals A are temporarily stored in the image processing unit 20. Data related to an area to be inspected (e.g. wire location data, wire bonded position data etc.) are extracted from all of the stored data for recognition of wire shapes, and measurement of x-y coordinates of bonded positions.

Figure 4A:
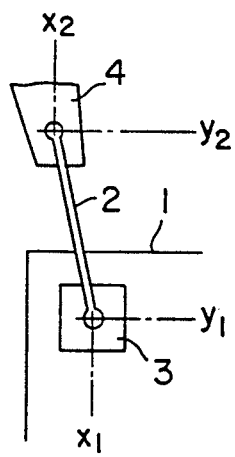
Figure 4B:
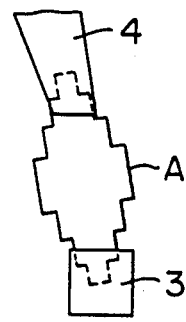
Figure 4C:
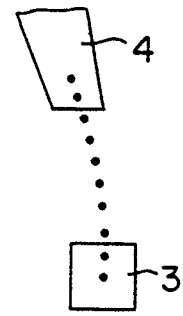

The recognition and measurement of wires and bonded positions will be described in more detail with reference to the attached drawings. In FIG. 4A, since it is previously known that a wire 2 is to be connected between an electrode pad 3 on a semiconductor chip 1 and an end of a lead 4, a nail head center on the chip 1 and a wire end on the lead 2 are searched and trimmed to obtain the coordinates $(x_1, y_1)$ of a center of the nail head on the chip and those $(x_2, y_2)$ of an end of the lead 2 for measurement. On the basis of these two wire end positions, a wire location area A in which the wire is to be laid is obtained in such a way that the wire middle portion is the widest when compared with both the end portions in consideration of wire bending shape, as shown in FIG. 4B. Furthermore, a brighter curved portion within this wire location area A is detected and stored as a wire presence position in the form of a dotted line as shown in FIG. 4C.

Figure 5:
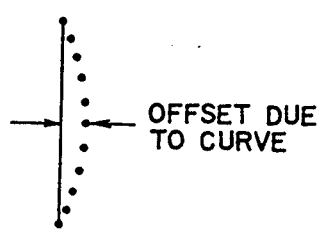
FIG. 5 is a plan view for explaining an offset from a normal line due to a curved wire.
Figure 6:
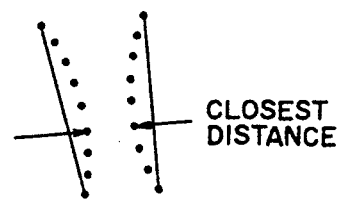
FIG. 6 is a plan view for explaining the closest distance between two adjacent wires.

On the basis of the above-mentioned dotted line data and the coordinates $(x_1, y_1)$ and $(x_2, y_2)$, it is possible to measure the maximum Offset due to wire curve from a straight line connected between the two bonding points as shown in FIG. 5 or the closest distance between the two adjacent wires as shown in FIG. 6, so that a short circuit between the two adjacent wires can be avoided, for instance.

The above-mentioned recognition and measurement results are supplied to the main controller 17. The main controller 17 compares these recognition and measurement results with reference data (criteria) stored in criteria storage unit 19. Here, the coordinate data representative of bonded positions supplied from the image processing unit 20 are relative data on an image formed by the optical cylinder 13. Therefore, the main controller 17 calculates coordinate data representative of absolute bonded positions on the basis of current absolute coordinate data of the optical cylinder 13 relative to the inspection base 11 supplied from the x-y table controller 16. That is, the obtained absolute coordinates of the bonded positions or the shapes of the wires are compared with the reference data (criteria) to decide chip acceptance or unacceptance as to whether the wires are bonded straight without disconnection and at the correct bonding positions. The inspected results are then displayed on the display unit 18.

Figure 3:
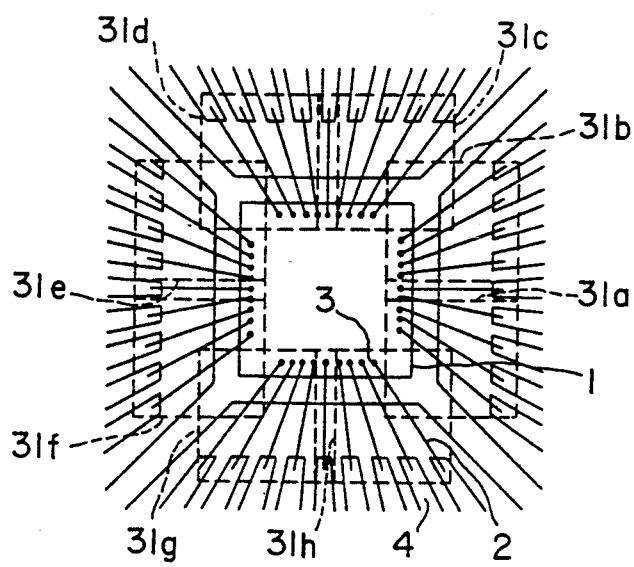
FIG. 3 is a plan view for assistance in explaining an inspection area by the apparatus of the present invention.

FIG. 3 shows an example of an image formed by the optical cylinder 13 when a semiconductor chip 1 is seen from above. Here, when the size of the semiconductor chip 1 is large, it is impossible to obtain an inspection image including all the wires 2, pads 3 and leads 4. In the inspecting apparatus of the present invention, however, since the optical cylinder 13 is movable on an x-y plane, it is possible to divide an image area to be inspected into several image areas 31a to 31h, as enclosed by dashed lines, and to inspect each of these divided areas in sequence. For instance, an image of the area 31a is first formed by the optical cylinder 13, transduced into video signals by the video unit 14, and recognized or measured by the image processing unit 20. The processed results are compared with the reference data and the acceptance or unacceptance of the wire bonding is decided by the main controller 17. After the area 31a has been inspected, the main controller 17 commands the x-y table controller 16 to shift the x-y table 15' so that an image of the area 31b can be formed next through the optical cylinder 13. Therefore, image data at the area 31b are applied to the image processing unit 20 via the optical cylinder 13 and the image unit 14 for the same succeeding inspection. The above operation is repeated in the order of 31a, 31b, 31c, . . . , 31h.

As described above, in the inspecting apparatus of the present invention, when the semiconductor chip is large in size, since an area to be inspected is divided into several sub-areas and the sub-areas are inspected in a predetermined sequence by moving the optical cylinder 13, it is possible to inspect semiconductor chips of various sizes. Therefore, in the present invention, it is possible to use a low-cost general-purpose CCD (charge-coupled device) camera. In this case, the image processing unit 20 can store video signals for one picture in about 1/60 sec. Furthermore, since it is possible to implement the storage operation of video signals and the recognition/measurement operation of the stored video signals in parallel simultaneously by the image processing unit 20, the inspection can be achieved at high speed. Furthermore, the areas to be inspected are previously determined according to models of semiconductor chips.

Furthermore, in the inspection apparatus according to the present invention, when a semiconductor chip 1 mounted on the inspection base 11 is offset from a correct mounting position, since the image processing unit 20 can detect the offset value on the basis of the transduced video signals and further the x-y table can be shifted by the x-y table controller in response to a common signal from the main controller 17, so that the chip can be automatically located correctly relative to the optical cylinder 13, it is possible to admit a relatively large allowability with respect to the semiconductor chip mallocation on the inspection base.

The above embodiment has been explained by way of example. In the above embodiment, the semiconductor chip is fixedly mounted and the image forming means, such as the optical cylinder and the video unit, is controllably moved relative to the chip. Without being limited thereto, however, as shown in FIG. 2, it is also possible to obtain the same effect by fixing the image forming means and by moving the x-y table 15' on which the inspection base for mounting the chip and the leads is placed. Furthermore, the illuminating means is provided fixedly or movably so that the area to be inspected can be illuminated. Furthermore, the inspecting apparatus is not necessarily limited to the composing elements as shown in FIG. 2. For instance, it is possible to adopt any given means for shifting the image forming means, without being limited to an x-y table.

What is claimed is:

1. A wire bonding inspecting apparatus for inspecting wires bonded between a semiconductor chip and associated leads, comprising:
   (a) mounting means for mounting the semiconductor chip wire-bonded to the leads;
   (b) illuminating means for illuminating the wires connected between the mounted semiconductor chip and the leads;
   (c) optical image pickup means for picking up an optical image of the illuminated wires in a predetermined area;
   (d) video signal generating means for transducing the optical image into video signals;
   (e) recognizing and measuring means responsive to the video signals, for recognizing wire shapes and measuring wire bonded positions for wire inspection;
   (f) storing means for storing wire inspection criteria;
   (g) acceptance deciding means for comparing the recognized wire shapes and the measured wire bonded positions with wire inspection criteria stored in the storing means, respectively, and generating an acceptance or a nonacceptance signal on the basis of the compared results;

(h) moving means for moving said mounting means relative to said optical image pickup means, or vice versa; and (i) control means for controlling the relative positional relationship between said mounting means and said optical image pickup means to shift from an inspection area to another inspection area when said predetermined inspection area is insufficient compared to whole chip area.

2. The wire bonding inspecting apparatus according to claim 1, wherein said predetermined area is previously determined according to models of semiconductor chips.

3. The wire bonding inspecting apparatus according to claim 1, wherein said moving means is an X-Y table.

4. The wire bonding inspecting apparatus according to claim 1, wherein said moving means is an X-Y optical pickup device.

* * * * *